United States Patent
Asaoka et al.

(10) Patent No.: US 12,268,072 B2
(45) Date of Patent: Apr. 1, 2025

(54) DISCLOSURE IS RELATED TO A DISPLAY DEVICE

(71) Applicant: SHARP KABUSHIKI KAISHA, Osaka (JP)

(72) Inventors: Yasushi Asaoka, Sakai (JP); Shigeru Aomori, Sakai (JP)

(73) Assignee: SHARP KABUSHIKI KAISHA, Sakai (JP)

(*) Notice: Subject to any disclaimer, the term of this patent is extended or adjusted under 35 U.S.C. 154(b) by 743 days.

(21) Appl. No.: 17/272,574

(22) PCT Filed: Sep. 7, 2018

(86) PCT No.: PCT/JP2018/033302
§ 371 (c)(1),
(2) Date: Mar. 1, 2021

(87) PCT Pub. No.: WO2020/049738
PCT Pub. Date: Mar. 12, 2020

(65) Prior Publication Data
US 2021/0359028 A1 Nov. 18, 2021

(51) Int. Cl.
H10K 59/35 (2023.01)
H01L 27/15 (2006.01)
H05B 33/14 (2006.01)
H10K 50/11 (2023.01)
H10K 50/115 (2023.01)
H10K 71/00 (2023.01)

(52) U.S. Cl.
CPC ......... *H10K 59/352* (2023.02); *H01L 27/156* (2013.01); *H05B 33/14* (2013.01); *H10K 50/11* (2023.02); *H10K 59/353* (2023.02); *H10K 71/00* (2023.02); *H10K 50/115* (2023.02)

(58) Field of Classification Search
CPC .... H10K 59/352; H10K 59/353; H10K 50/11; H05B 33/14
See application file for complete search history.

(56) References Cited

U.S. PATENT DOCUMENTS 6,288,486 B1 * 9/2001 Tsuruoka ............. H10K 50/125
313/506
6,366,025 B1 4/2002 Yamada
(Continued)

FOREIGN PATENT DOCUMENTS

JP 2001290441 A 10/2001
JP 2003257657 A 9/2003
(Continued)

*Primary Examiner* — Aaron J Gray
(74) *Attorney, Agent, or Firm* — ScienBiziP, P.C.

(57) ABSTRACT

A display device according to an aspect of the disclosure includes: a first subpixel including a first pixel electrode, a second subpixel adjacent to the first subpixel and including a second pixel electrode, and a third subpixel adjacent to the first subpixel and including a third pixel electrode, a first light-emitting layer overlapping the entire first pixel electrode, a second light-emitting layer overlapping the entire second pixel electrode, and a third light-emitting layer overlapping the entire third pixel electrode, wherein an entire circumference of a peripheral edge portion of the first pixel electrode overlaps the first light-emitting layer and at least one of the second light-emitting layer and the third light-emitting layer.

18 Claims, 11 Drawing Sheets

(56) References Cited

U.S. PATENT DOCUMENTS

| | | | |
|---|---|---|---|
| 6,815,723 B2* | 11/2004 | Yamazaki | H10K 71/00 |
| | | | 313/506 |
| 2003/0122140 A1 | 7/2003 | Yamazaki et al. | |
| 2005/0045917 A1* | 3/2005 | Yamazaki | H01L 21/67207 |
| | | | 257/202 |
| 2006/0208263 A1 | 9/2006 | Yamazaki et al. | |
| 2007/0114922 A1 | 5/2007 | Sung et al. | |
| 2009/0008643 A1 | 1/2009 | Yamazaki et al. | |
| 2010/0237323 A1* | 9/2010 | Akai | C09K 11/565 |
| | | | 257/13 |
| 2010/0295052 A1 | 11/2010 | Yamazaki et al. | |
| 2010/0295828 A1 | 11/2010 | Sung et al. | |
| 2011/0266548 A1 | 11/2011 | Yamazaki et al. | |
| 2014/0319499 A1 | 10/2014 | Yamazaki et al. | |
| 2017/0005146 A1 | 1/2017 | Yamazaki et al. | |
| 2018/0179441 A1 | 6/2018 | Park et al. | |

FOREIGN PATENT DOCUMENTS

| | | |
|---|---|---|
| JP | 2007141847 A | 6/2007 |
| JP | 2008077953 A | 4/2008 |
| JP | 2018507526 A | 3/2018 |
| WO | 2009/041595 A1 | 4/2009 |

* cited by examiner (a)

(b)

DISCLOSURE IS RELATED TO A DISPLAY DEVICE

TECHNICAL FIELD

The present invention is related to a display device.

BACKGROUND ART

PTL 1 discloses a configuration for a display device including an organic light-emitting layer formed on an anode electrode, in which an edge of the anode electrode is covered with an insulating film (edge cover).

CITATION LIST

Patent Literature

PTL 1: JP 2008-077953A (published on Apr. 3, 2008)

SUMMARY OF INVENTION

Technical Problem

In the above-described configuration, an exposed portion of the anode electrode (the portion not covered with the edge cover) may be degraded in a process for patterning the edge cover.

Solution to Problem

A display device according to an aspect of the disclosure includes: a first subpixel including a first pixel electrode; a second subpixel adjacent to the first subpixel and including a second pixel electrode; a third subpixel adjacent to the first subpixel and including a third pixel electrode; a first light-emitting layer overlapping an entire of the first pixel electrode; a second light-emitting layer overlapping an entire of the second pixel electrode; and a third light-emitting layer overlapping an entire of the third pixel electrode, wherein an entire circumference of a peripheral edge portion of the first pixel electrode overlaps the first light-emitting layer and at least one of the second light-emitting layer and the third light-emitting layer.

Advantageous Effects of Disclosure

According to an aspect of the disclosure, since the peripheral edge portion of the first pixel electrode overlaps, throughout the entire circumference thereof, the plurality of light-emitting layers, formation of an insulating film (edge cover) covering the edge of the first pixel electrode is unnecessary, and in addition to reducing the number of processes, degradation of the first pixel electrode can be avoided.

DESCRIPTION OF EMBODIMENTS

Hereinafter, "the same layer" means that the layer is formed in the same process (film formation process), "a lower layer" means that the layer is formed in an earlier process than the process in which the layer to compare is formed, and "an upper layer" means that the layer is formed in a later process than the process in which the layer to compare is formed.

Figure 1:
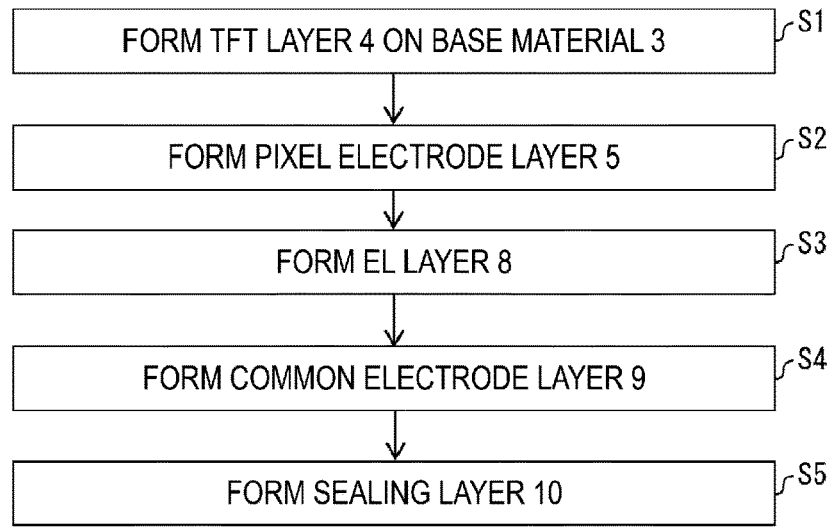
FIG. 1(a) is a flowchart illustrating an example of a method for manufacturing a display device.
FIG. 1(b) is a schematic view illustrating a cross-section configuration of the display device.
Figure 1:
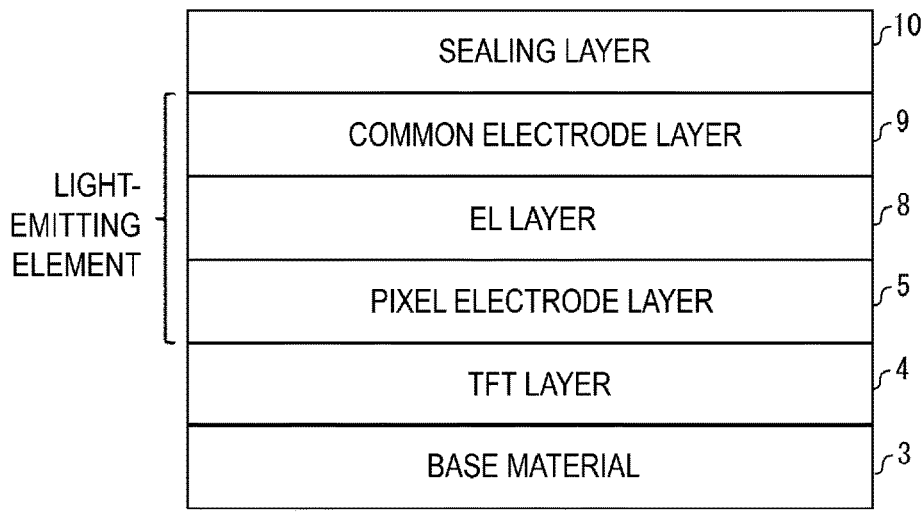

FIG. 1(a) is a flowchart illustrating an example of a method for manufacturing a display device, and FIG. 1(b) is a schematic view illustrating a cross-section configuration of the display device. As illustrated in FIG. 1, in manufacturing the display device, first, a TFT layer 4 is formed on a base material 3 (step S1). Next, a pixel electrode layer 5 is formed (step S2). Next, an electroluminescence (EL) layer 8 is formed (step S3). The EL layer 8 may be formed by a photolithographic method, or by a vapor deposition using a fine metal mask (FMM), for example. Next, a common electrode layer 9 is formed (step S4). Next, a sealing layer 10 is formed (step S5). Steps S1 to S4 are performed by a display device manufacturing apparatus (including a film formation apparatus that performs step S3).

Glass or a resin such as polyimide can be used for the base material 3. A barrier film made of silicon nitride or the like may be formed by film formation on the glass or resin to form the base material 3.

The TFT layer 4 is provided with a semiconductor layer, a plurality of metal layers, and a plurality of insulating layers, and a plurality of TFTs (thin film transistors) are formed. A control circuit for a light-emitting element (for example, a light emitting diode) including the pixel electrode layer 5, the EL layer 8, and the common electrode layer 9 is formed in the TFT layer 4.

The pixel electrode layer 5 includes a plurality of pixel electrodes having light reflectivity, the EL layer 8 includes a plurality of light-emitting layers (e.g., quantum dot layers, organic light-emitting layers), and the common electrode layer 9 includes a common electrode having optical transparency.

The pixel electrode layer 5 is formed by layering Indium Tin Oxide (ITO) and aluminum (Al), or silver (Ag) or an alloy containing Ag, for example. The common electrode layer 9 is formed of an Mg—Ag alloy (ultra-thin film), ITO, indium zinc oxide (IZO), and silver nanowires, for example. A work function differs between the pixel electrode layer 5 and the common electrode layer 9. The pixel electrode layer 5 may be on an anode side (high-voltage side) and the common electrode layer 9 may be on cathode side (low voltage side), or the pixel electrode layer 5 may be on the cathode side (low-voltage side) and the common electrode layer 9 may be on the anode side (high-voltage side).

In a display region of the display device, a plurality of light-emitting elements including the pixel electrode layer 5, the EL layer 8, and the common electrode layer 9 are provided, and a driver that drives the TFT layer 4 and the like is provided to an outside of the display region (frame region).

In a case where the light-emitting element is a quantum dot light emitting diode (QLED), positive holes and electrons recombine inside the light-emitting layer in response to a drive current between the pixel electrode and the common electrode, and when excitons generated due to this recombination transition from a conduction band to a valence band of the quantum dots, light (fluorescence) is emitted. Since the common electrode is transparent and the pixel electrode is light-reflective, the light emitted from the EL layer 8 travels upwards and results in top-emitting.

In a case where the light-emitting element is an organic light-emitting diode (OLED), positive holes and electrons recombine inside the light-emitting layer in response to a drive current between the pixel electrode and the common electrode, and when excitons generated due to this recombination transition to a ground state, light is emitted. The light-emitting element is not limited to QLED or OLED, and may be an inorganic light emitting diode or the like.

The transparent sealing layer 10 includes an inorganic insulating film made of silicon nitride or the like, and inhibits foreign matters such as water and oxygen from infiltrating to the light-emitting element.

First Embodiment

Figure 2:
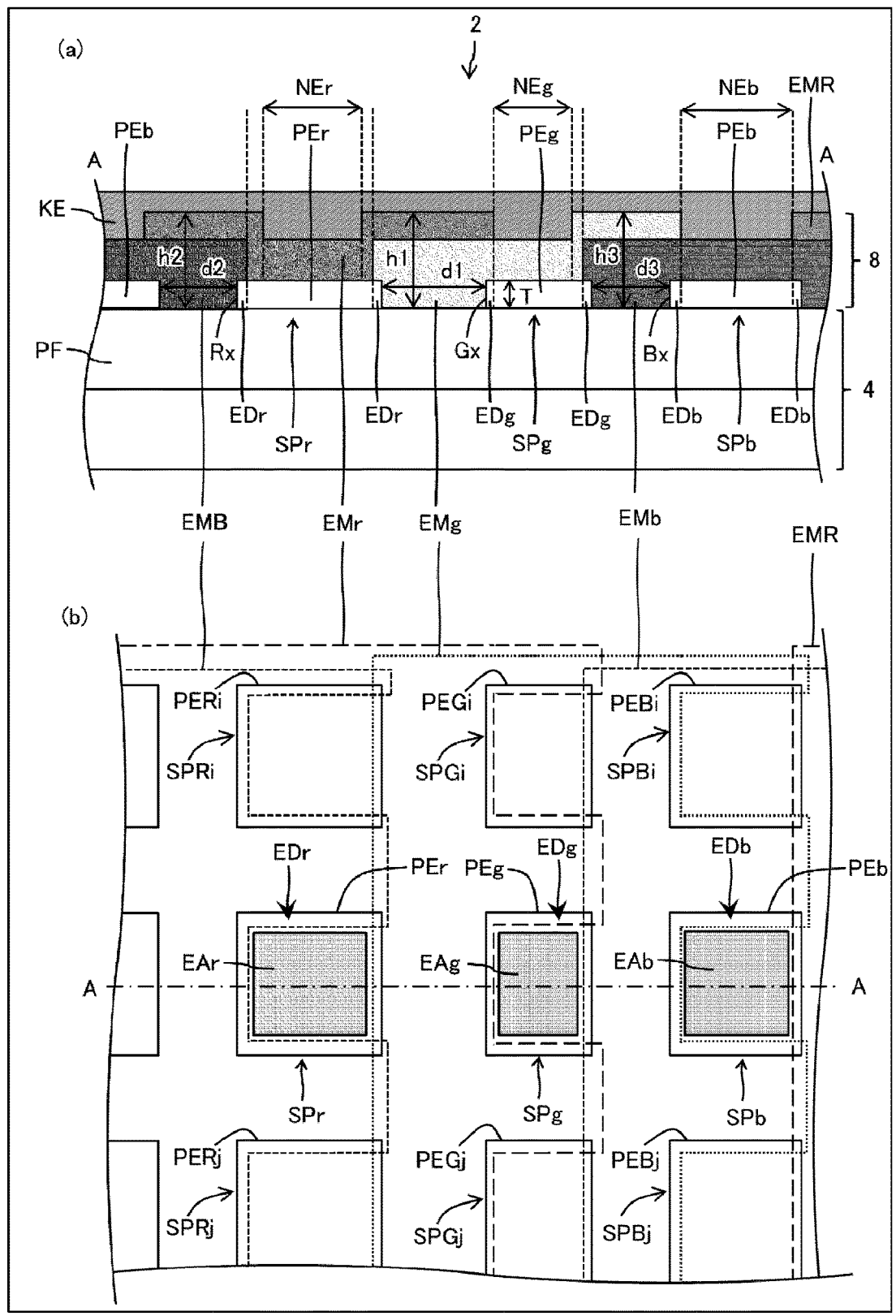
FIG. 2 is a correspondence diagram of cross-sectional and plan views of a display device according to a first embodiment.
Figure 3:
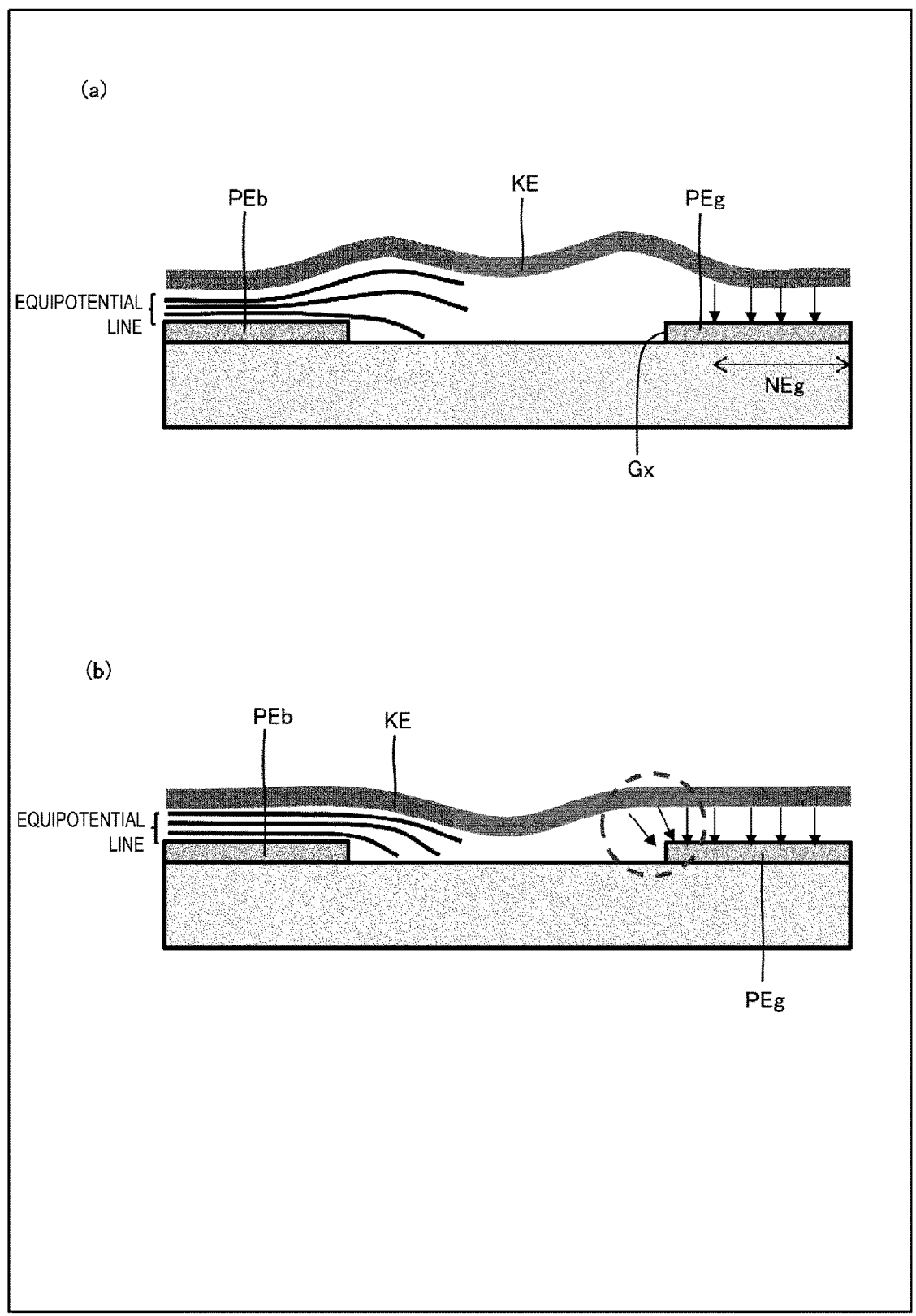
FIG. 3(a) is a schematic cross-sectional view illustrating an effect of the first embodiment.
FIG. 3(b) is a schematic cross-sectional view illustrating a comparative example.

FIG. 2 is a correspondence diagram of cross-sectional and plan views of a display device according to a first embodiment. FIG. 3(a) is a schematic cross-sectional view illustrating an effect of the first embodiment, and FIG. 3(b) is a schematic cross-sectional view illustrating a comparative example.

In FIG. 2, a subpixel SPr emitting a red light, a subpixel SPg emitting a green light, and a subpixel SPb emitting a blue light are arranged in this order in a row direction (right-left direction). The subpixel SPg (first subpixel) includes a rectangular pixel electrode PEg (first pixel electrode). The subpixel SPr (second subpixel) including a rectangular pixel electrode PEr (second pixel electrode) and the subpixel SPb (third subpixel) including a rectangular pixel electrode PEb (third pixel electrode) are adjacent to the subpixel SPg. The pixel electrodes PEr, PEg, and PEb are respectively formed on an organic insulating film PF (a flattening film made of polyimide or the like), which is an uppermost layer of the TFT layer 4, and are connected to transistors (not illustrated) formed in the TFT layer 4. The pixel electrodes PEg, PEr, and PEb are not limited to rectangular shapes, and may be circular, elliptical, or the like. A subpixel SPGi (fourth subpixel) and the subpixel SPGj (fifth subpixel) adjacent to the subpixel SPg in a column direction (up-down direction) are included in a green subpixel column (line).

The EL layer 8 is provided with a light-emitting layer EMg (first light-emitting layer) overlapping the entire pixel electrode PEg, a light-emitting layer EMr (second light-emitting layer) overlapping the entire pixel electrode PEr, and a light-emitting layer EMb (third light-emitting layer) overlapping the entire pixel electrode PEb. In step S3 of FIG. 1, the light-emitting layers EMb and EMB emitting a blue light, the light-emitting layer EMg emitting a green light, and the light-emitting layers EMr and EMR emitting a red light are formed in this order, and the light-emitting layer EMg is upper than the light-emitting layers EMb and EMB, and lower than the light-emitting layers EMr and EMR. In the common electrode layer 9 in FIG. 1, a common electrode KE covering the light-emitting layers EMr, EMR, EMg, EMb, and EMB is formed.

The light-emitting layer EMr is a quantum dot layer, and includes quantum dots, ligands, and photosensitive resin for emitting a red light. The light-emitting layer EMg is a quantum dot layer, and includes quantum dots, ligands, and photosensitive resin for emitting a green light. The light-emitting layer EMb is a quantum dot layer, and includes quantum dots, ligands, and photosensitive resin for emitting a blue light.

In each subpixel, the pixel electrode may function as an anode and the common electrode may function as a cathode, or the pixel electrode may function as a cathode and the common electrode may function as an anode.

In the first embodiment, an entire circumference of a peripheral edge portion EDg of the pixel electrode PEg overlaps the light-emitting layer EMg and at least one of the light-emitting layer EMr and the light-emitting layer EMb. Specifically, the peripheral edge portion EDg of the pixel electrode PEg includes a portion overlapping the light-emitting layer EMg and the light-emitting layer EMr, a portion overlapping the light-emitting layer EMg and the light-emitting layer EMb, and a portion overlapping the light-emitting layer EMg, and the light-emitting layer EMr and the light-emitting layer EMb, and therefore, no current flows through the peripheral edge portion EDg (not contributing to green light emission). In the pixel electrode PEg, the valid portion NEg located inside the peripheral edge portion EDg overlaps only the light-emitting layer EMg, and does not overlap the light-emitting layer EMr and the light-emitting layer EMb, and therefore, a current flows through the valid portion NEg (contributing to green light emission).

An entire circumference of a peripheral edge portion EDr of the pixel electrode PEr overlaps the light-emitting layer EMr and at least one of the light-emitting layer EMB and the light-emitting layer EMg. Specifically, the peripheral edge portion EDr of the pixel electrode PEr includes a portion overlapping the light-emitting layer EMr and the light-emitting layer EMB, a portion overlapping the light-emitting layer EMr and the light-emitting layer EMg, and a portion overlapping the light-emitting layer EMr, and the light-emitting layer EMB and the light-emitting layer EMg, and therefore, no current flows through the peripheral edge portion EDr (not contributing to red light emission). In the pixel electrode PEr, a valid portion NEr located inside the peripheral edge portion EDr overlaps only the light-emitting layer EMr, and does not overlap the light-emitting EMg and the light-emitting layer EMB, and therefore, a current flows through the valid portion NEg (contributing to red light emission).

An entire circumference of a peripheral edge portion EDb of the pixel electrode PEb overlaps the light-emitting layer EMb and at least one of the light-emitting layer EMg and the light-emitting layer EMR. Specifically, the peripheral edge portion EDb of the pixel electrode PEb includes a portion overlapping the light-emitting layer EMb and the light-emitting layer EMg, a portion overlapping the light-emitting layer EMb and the light-emitting layer EMR, and a portion overlapping the light-emitting layer EMb, and the light-emitting layer EMg and the light-emitting layer EMR, and therefore, no current flows through the peripheral edge portion EDb (not contributing to blue light emission). In the pixel electrode PEb, a valid portion NEb located inside the peripheral edge portion EDb overlaps only the light-emitting layer EMb, and does not overlap the light-emitting layer EMg and the light-emitting layer EMR, and therefore, a current flows through the valid portion NEb (contributing to blue light emission).

A pixel electrode PEGi (fourth pixel electrode) and a pixel electrode PEGj (fifth pixel electrode) adjacent to the pixel electrode PEg are included in the green subpixel column (line), and the entire pixel electrode PEGi and the entire pixel electrode PEGj overlap the light-emitting layer EMg that emits a green light.

In FIG. 2, each of the light-emitting layer EMg, the light-emitting layer EMr, and the light-emitting layer EMg is a layer common to a plurality of adjacent subpixels of the same color. The light-emitting layer EMg overlaps, in common, portions of peripheral edge portions of a plurality of pixel electrodes PERi and PERj included in a plurality of subpixels SPRi and SPRj of the same color (red) as the subpixel SPr. Further, the light-emitting layer EMg overlaps, in common, portions of peripheral edge portions of a plurality of pixel electrodes PEBi and PEBj included in a plurality of subpixels SPBi and SPBj of the same color (blue) as the subpixel SPb. The light-emitting layer EMr overlaps, in common, portions of peripheral edge portions of the plurality of pixel electrodes PEGi and PEGj included in the plurality of subpixels SPGi and SPGj of the same color (green) as the subpixel SPg. Further, the light-emitting layer EMr overlaps, in common, portions of the peripheral edge portions of the plurality of pixel electrodes PEBi and PEBj included in the plurality of subpixels SPBi and SPBj of the same color (blue) as the subpixel SPb. The light-emitting layer EMb overlaps, in common, portions of the peripheral edge portions of the plurality of pixel electrodes PEGi and PEGj included in the plurality of subpixels SPGi and SPGj of the same color (green) as the subpixel SPg. Further, the light-emitting layer EMb overlaps, in common, portions of the peripheral edge portions of the plurality of pixel electrodes PERi and PERj included in the plurality of subpixels SPRi and SPRj of the same color (red) as the subpixel SPr.

In the first embodiment, the plurality of light-emitting layers (multiple light-emitting layers) overlapping the peripheral edge portions of the pixel electrodes PEr, PEg, and PEb function as an edge cover (an insulating film covering an edge of the pixel electrode), a phenomenon in which the edge of the pixel electrode deteriorates (the so-called subpixel shrink) can be suppressed. Since the edge cover is not required to be formed, the number of processes is reduced, and the valid portions NEr, NEg, and NEb of the pixel electrodes are not degraded.

In FIG. 2, an area of the valid portion NEg of the pixel electrode PEg<an area of the valid portion NEr of the pixel electrode PEr<an area of the valid portion NEb of the pixel electrode PEb, and an area of a light-emitting region EAg of the subpixel SPg (green)<an area of a light-emitting region EAr of the subpixel SPr (red)<an area of a light-emitting region EAb of the subpixel SPb (blue). In this configuration, a current density in the valid portion NEb of the pixel electrode PEb can be reduced, and a service life of the blue subpixel SPb, which is generally prone to degradation, can be extended.

A gap between the pixel electrodes PEg and PEr overlaps at least the light-emitting layers EMg and EMr, and a width d1 of this gap is greater than a distance h1 between the organic insulating film PF and the common electrode KE in this gap. This can eliminate a leakage current between the pixel electrodes PEg and PEr.

Furthermore, h1>a thickness T of the pixel electrode PEg, and as illustrated in FIG. 3(a), the common electrode KE has a shape convex downward over the pixel electrode PEg. In this configuration, a distance to the common electrode KE is longer over an edge Gx than over near the valid portion NEg of the pixel electrode PEg, so an electric field does not concentrate at an end of the valid portion NEg (an overcurrent does not flow), and the shrink of the light-emitting region EAg can be prevented. Note that as illustrated in FIG. 3(b), if the distance to the common electrode KE is shorter over near the edge than over the valid portion of the pixel electrode PEg, the electric field may concentrate at the end of the valid portion (overcurrent flows), and the light-emitting region may shrink.

In a planar view, a distance (non-light-emitting width) from the edge Gx of the pixel electrode PEg to the light-emitting region EAg of the subpixel SPg is smaller than a width (length in the row direction) of the light-emitting region EAg, and thereby, the light-emitting region EAg is widened to ensure a luminance of the subpixel SPg.

In FIG. 2, a gap between the pixel electrodes PEr and PEb overlaps the light-emitting layers EMB and EMr, a width d2 of this gap is greater than a distance h2 between the organic insulating film PF and the common electrode KE in this gap, and h2>a thickness T of the pixel electrode PEr. The common electrode KE has a shape convex downward over the pixel electrode PEr. In a planar view, a distance (non-light-emitting width) from an edge Rx of the pixel electrode PEr to the light-emitting region EAr of the subpixel SPr is smaller than a width of the light-emitting region EAr.

A gap between the pixel electrodes PEg and PEb overlaps the light-emitting layers EMb and EMg, and a width d3 of this gap is greater than a distance h3 between the organic insulating film PF and the common electrode KE in this gap, and h3>a thickness T of the pixel electrode PEb. The common electrode KE has a shape convex downward over the pixel electrode PEb. In a planar view, a distance (non-light-emitting width) from an edge Bx of the pixel electrode PEb to the light-emitting region EAb of the subpixel SPb is smaller than a width of the light-emitting region EAb.

Figure 4:
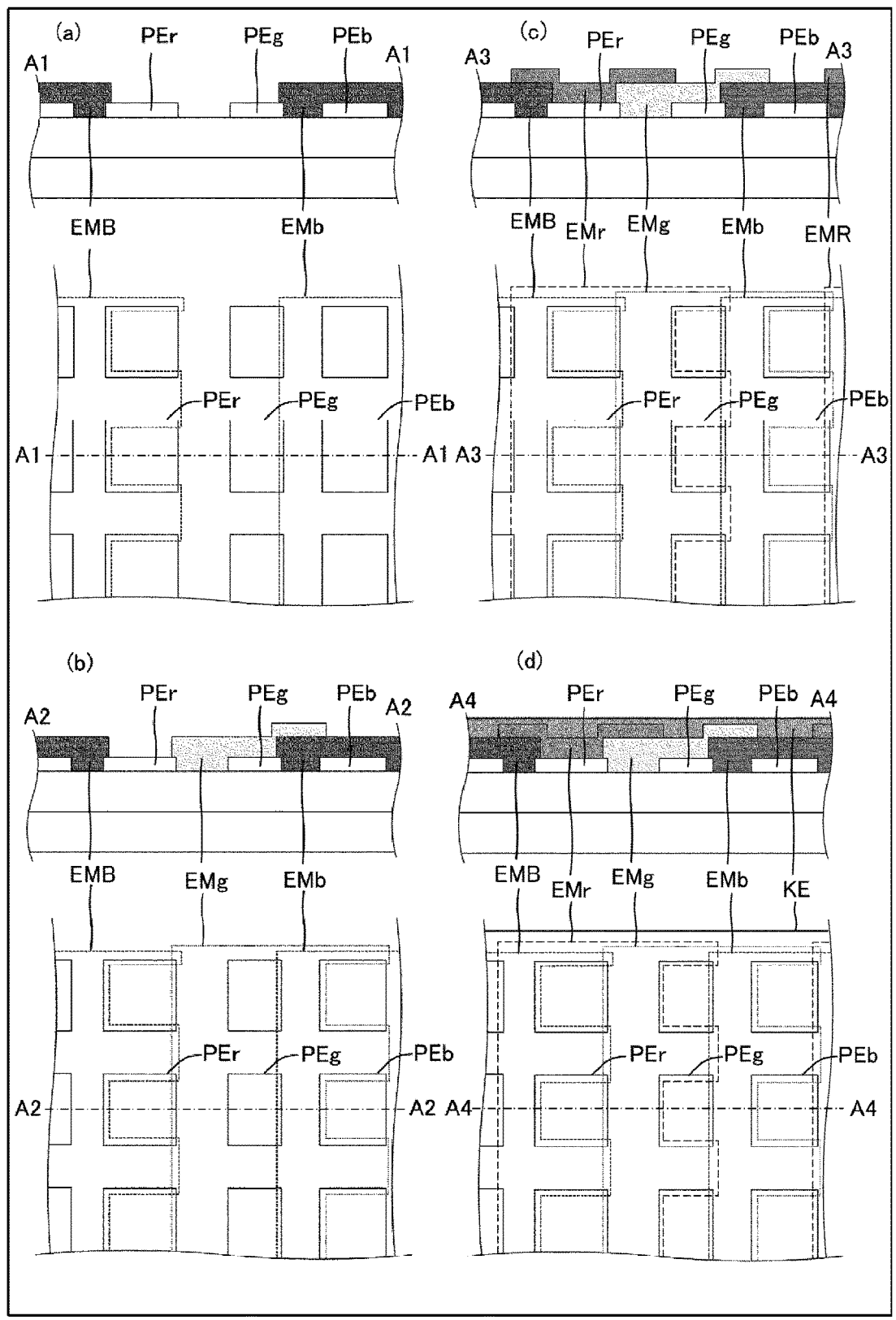
FIGS. 4(a) to 4(d) are correspondence diagrams of cross-sectional and plan views illustrating a process for forming an EL layer and a common electrode layer in the first embodiment.
Figure 5:
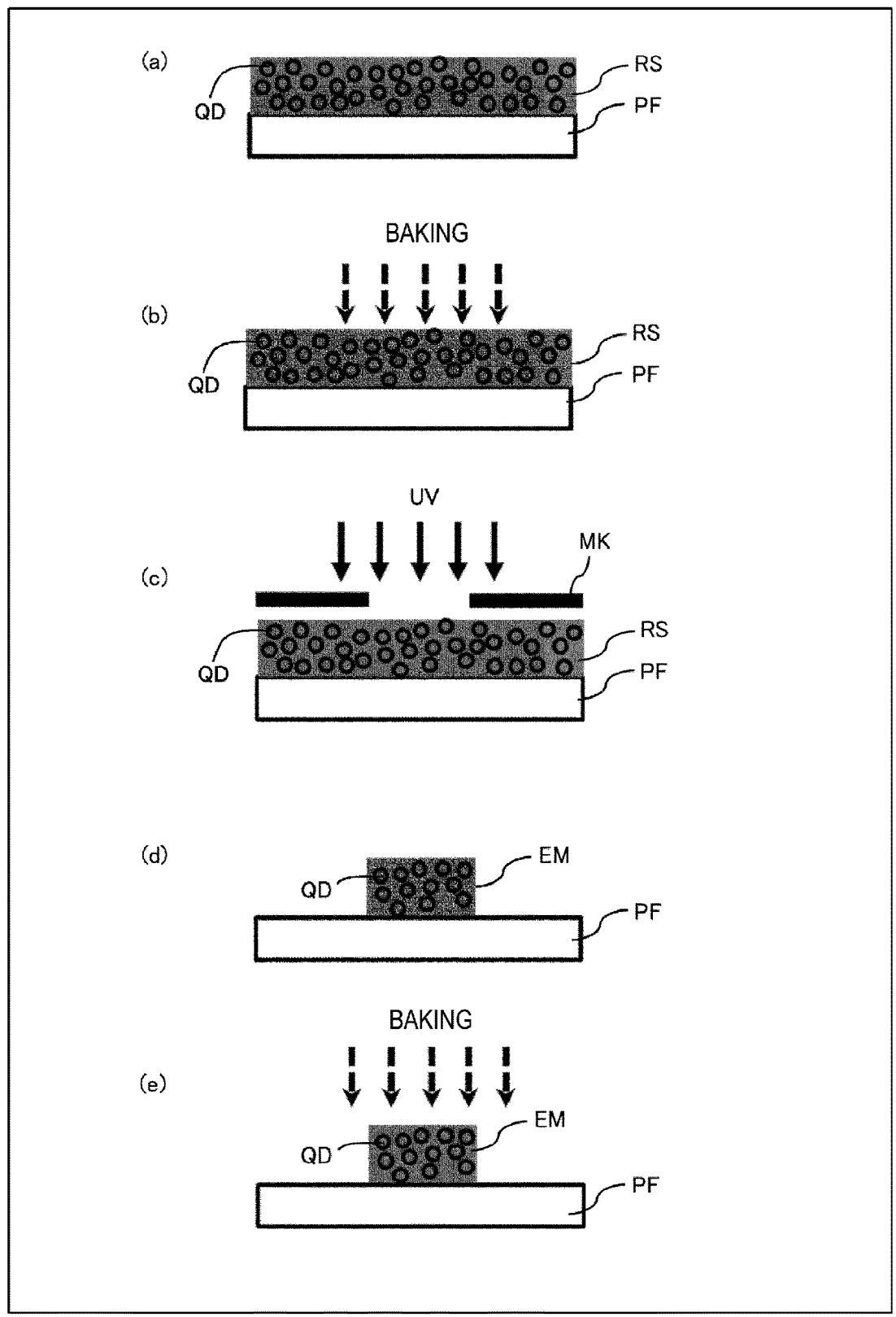
FIGS. 5(a) to 5(e) are schematic cross-sectional views illustrating a process for patterning the EL layer.

FIG. 4 is a correspondence diagram of cross-sectional and plan views illustrating a process for forming the EL layer and the common electrode layer in the first embodiment. FIG. 5 is a schematic cross-sectional view illustrating a process for patterning the EL layer.

In forming the EL layer 8, first, the blue light-emitting layer EMb overlapping the entire pixel electrode PEb as illustrated in FIG. 4(a) and a plurality of blue light-emitting layers (including the light-emitting layer EMB) separated from the light-emitting layer EMb are pattern formed. Next, as illustrated in FIG. 4(b), the green light-emitting layer EMg overlapping the entire pixel electrode PEg and a plurality of green light-emitting layers (not illustrated) separated from the light-emitting layer EMg are pattern formed. Next, as illustrated in FIG. 4(c), the light-emitting layer EMr overlapping the entire pixel electrode PEr and a plurality of red light-emitting layers (not illustrated) separated from the light-emitting layer EMr are pattern formed. Next, as illustrated in FIG. 4(d), the common electrode KE covering the light-emitting layers EMb, EMg, and EMr is formed. As illustrated in FIG. 4, planar shapes of the blue light-emitting layer EMb, the green light-emitting layer EMg, and the red light-emitting layer EMr are different from each other.

Since an order of a size of an emission wavelength matches an order of a size of a particle diameter of the quantum dot in a case of the same material, by forming the blue light-emitting layer, the green light-emitting layer, and the red light-emitting layer in this order, the plurality of light-emitting layers overlapping the peripheral edge portion of the pixel electrode are configured such that, as illustrated in FIG. 4, a light-emitting layer having a larger emission wavelength (a larger particle diameter of the quantum dot) is positioned in an upper layer than a light-emitting layer having a smaller emission wavelength (a smaller particle diameter of the quantum dot). This can solve problems such as the quantum dots in the light-emitting layer of the upper layer fall into the gaps of the quantum dots in the light-emitting layer of the lower layer.

In a case where quantum dots made of materials different in luminescent colors are used, or in a case where quantum dots having a core-shell structure are used, since a light-emitting layer having a larger particle diameter of the quantum dot is positioned in an upper layer than a light-emitting layer having a smaller particle diameter of the quantum dot regardless of the luminescent color, the problems such as the quantum dots in the light-emitting layer of the upper layer fall into the gaps of the quantum dots in the light-emitting layer of the lower layer can be solved. Since the light-emitting layer absorbs a light having a wavelength smaller than the emission wavelength, in the case where the light-emitting layer having a larger emission wavelength is positioned in the upper layer, unintentional fluorescent emission from the lower layer is suppressed when the light-emitting layer is irradiated with an external light. The "particle diameter" of the quantum dot described here is a design value, and in fact, refers to a median particle diameter as measured by dynamic light scattering. The particle diameters of the individual quantum dots include variations and may have an error of about 20%.

The light-emitting layer (EMb, EMg, EMr) can be pattern formed as follows. First, as illustrated in FIG. 5(a), a photosensitive resin (resist) RS containing quantum dots and ligands is applied on the organic insulating film PF (application thickness is, for example, 10 to 100 nm). Next, as illustrated in FIG. 5(b), the applied resist RS is prebaked at 80 to 120° C. to evaporate a solvent and dry a coating film. Next, as illustrated in FIG. 5(c), the dried resist RS is subjected to UV exposure over a mask MK (exposure intensity is, for example, 10 to 1000 [mJ/cm$^2$]). Next, as illustrated in FIG. 5(d), the resultant is developed using an alkali solution, organic solvent, water, or the like (where a UV irradiated portion dissolves in a positive-working resist, and a UV non-irradiated portion dissolves in the negative-working resist) to obtain a pattern formed light-emitting layer EM. Thereafter, main baking is performed as necessary at 100 to 200° C., for example, as illustrated in FIG. 5(e). The main baking promotes a polymerization reaction or a curing reaction, and suppresses gas release from the photosensitive resin.

Figure 6:
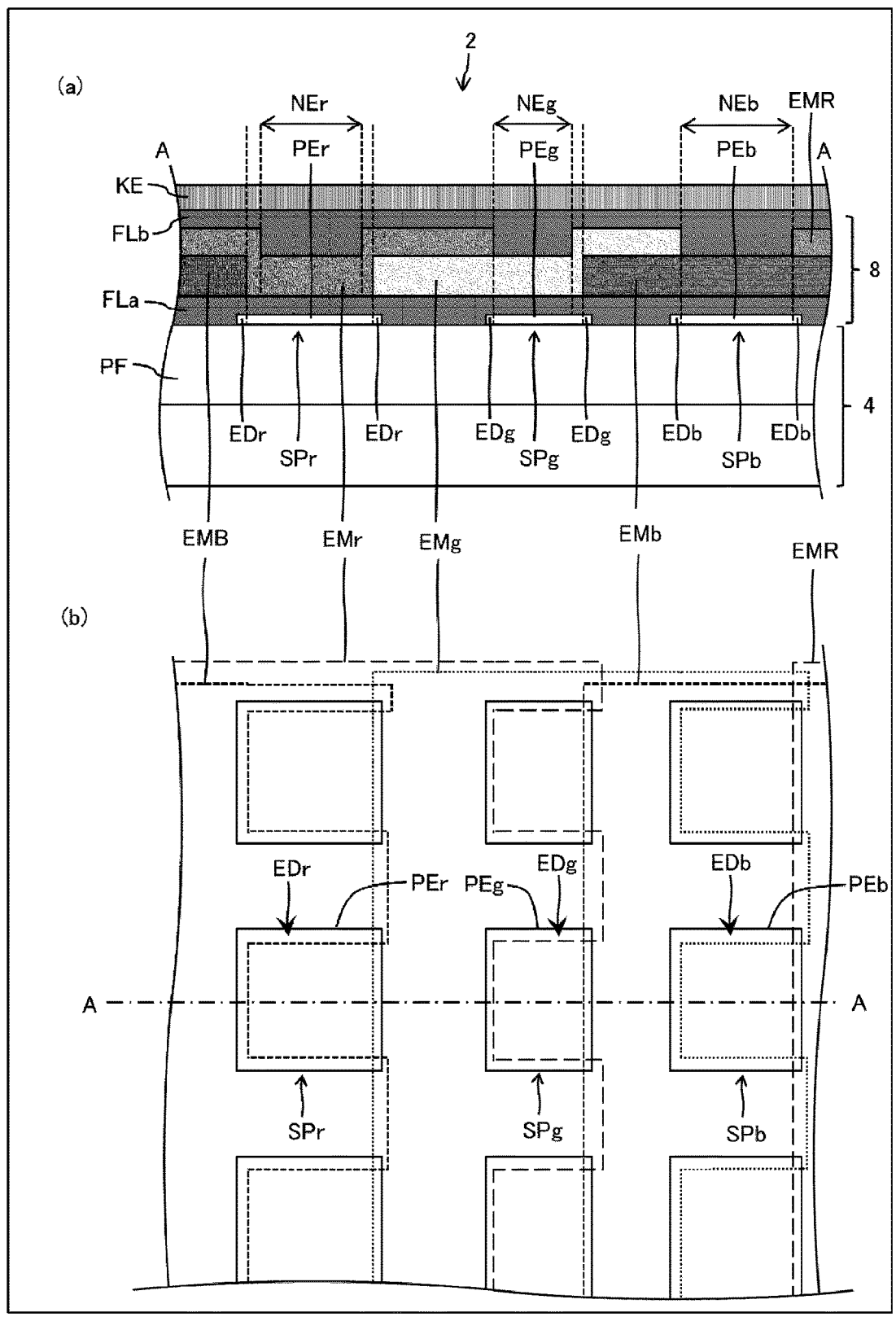
FIG. 6 is a correspondence diagram of cross-sectional and plan views illustrating a modification example of the first embodiment.

FIG. 6 is a correspondence diagram of cross-sectional and plan views illustrating a modification example of the first embodiment. As illustrated in FIG. 6, the EL layer 8 may be provided with a lower function layer FLa and an upper function layer FLb, which are common layers between the plurality of subpixels. In this case, the lower function layer FLa, the light-emitting layer EMg, the upper function layer FLb, and the common electrode KE are layered in this order on the valid portion NEg of the pixel electrode PEg, the lower function layer FLa, the light-emitting layer EMr, the upper function layer FLb, and the common electrode KE are layered in this order on the valid portion NEr of the pixel electrode PEr, and the lower function layer FLa, the light-emitting layer EMb, the upper function layer FLb, and the common electrode KE are layered in this order on the valid portion NEb of the pixel electrode PEb. In a normal structure in which the pixel electrode functions as the anode and the common electrode functions as the cathode, the lower function layer FLa may include a hole injection layer and a hole transport layer, and the upper function layer FLb may include an electron injection layer and an electron transport layer. In an inverter structure in which the pixel electrode functions as the cathode and the common electrode functions as the anode, the lower function layer FLa may include an electron injection layer and an electron transport layer, and the upper function layer FLb may include a hole injection layer and a hole transport layer. The hole injection layer and the electron injection layer are collectively referred to as a charge injection layer, the hole transport layer and the electron transport layer are collectively referred to as a charge transport layer, and the charge injection layer and the charge transport layer are the function layers. Furthermore, the function layer also includes an insulating blocking layer formed between the light-emitting layer and the charge transport layer or the charge injection layer.

In FIG. 6, the lower function layer FLa is formed in a solid-like form to contact the entire pixel electrode PEg, the entire pixel electrode PEr, and the entire pixel electrode PEb, and gaps between adjacent pixel electrodes are filled with the lower function layer FLa.

Second Embodiment

Figure 7:
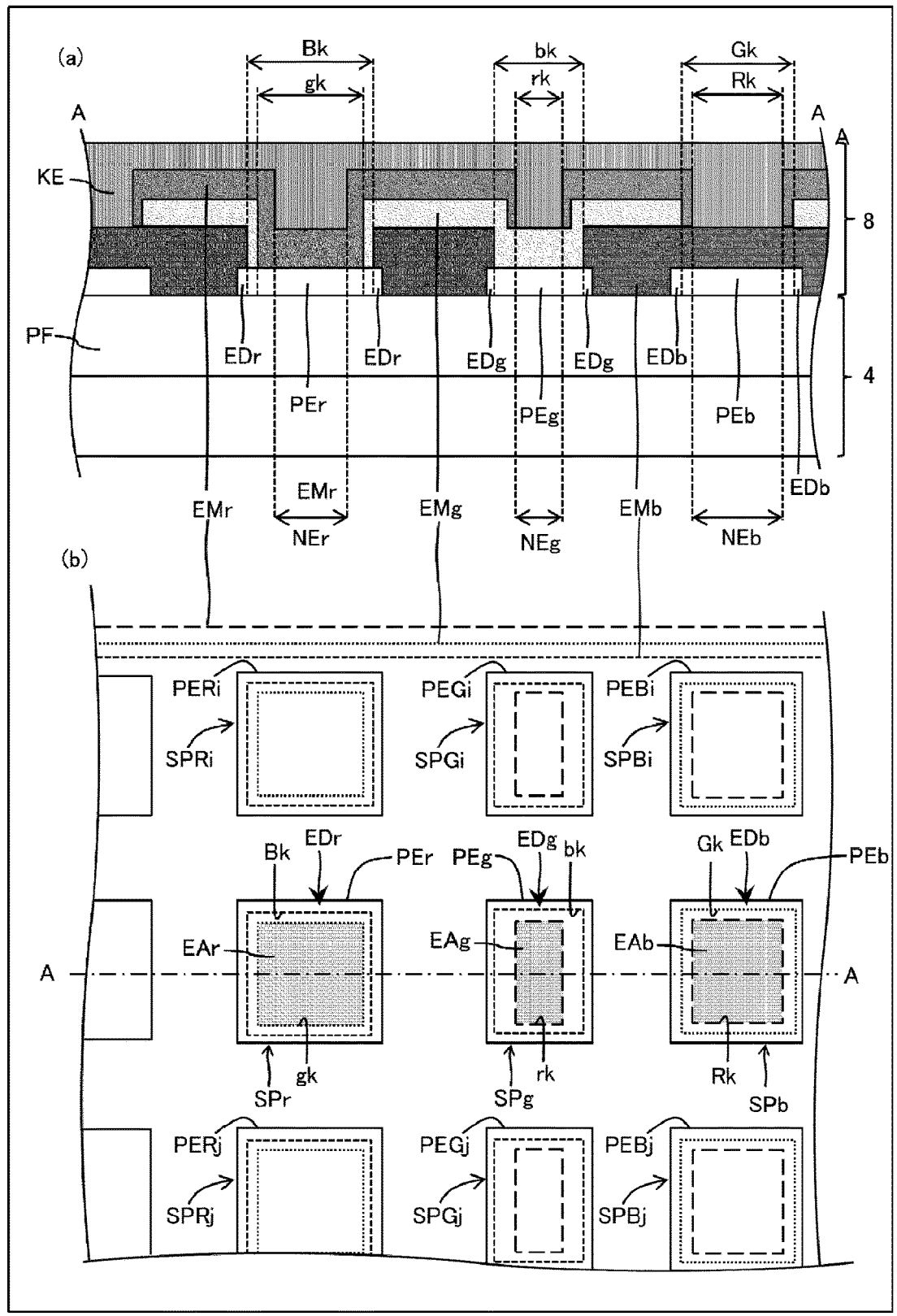
FIG. 7 is a correspondence diagram of cross-sectional and plan views of a display device according to a second embodiment.

FIG. 7 is a correspondence diagram of cross-sectional and plan views of a display device according to a second embodiment. In the second embodiment, formed in the order from a lower layer side are the (blue) light-emitting layer EMb overlapping the entire pixel electrode PEb, the (green) light-emitting layer EMg overlapping the entire pixel electrode PEg, and the (red) light-emitting layer EMr overlapping the entire pixel electrode PEr. The light-emitting layers EMb, EMg, and EMr are formed in a solid-like form across the entire display region, and the light-emitting layer EMb is provided with an opening bk overlapping with the pixel electrode PEg and an opening Bk overlapping the pixel electrode PEr, the light-emitting layer EMg is provided with an opening gk overlapping the pixel electrode PEr and an opening Gk overlapping the pixel electrode PEb, and the light-emitting layer EMr is provided with an opening rk overlapping with the pixel electrode PEg and an opening Rk overlapping the pixel electrode PEb.

In FIG. 7, the opening bk overlaps the entire opening rk, the pixel electrode PEg overlaps the entire opening rk and the entire opening bk, and the entire circumference of the peripheral edge portion EDg of the pixel electrode PEg overlaps the light-emitting layer EMg, and the light-emitting layer EMr and the light-emitting layer EMb, and therefore, no current flows through the peripheral edge portion EDg (not contributing to green light emission). In the pixel electrode PEg, the valid portion NEg located inside the peripheral edge portion EDg overlaps only the light-emitting layer EMg, and does not overlap the light-emitting layer EMr and the light-emitting layer EMb, and therefore, a current flows through the valid portion NEg (contributing to green light emission).

The opening Bk overlaps the entire opening gk, the pixel electrode PEr overlaps the entire opening gk and the entire opening Bk, and the entire circumference of the peripheral edge portion EDr of the pixel electrode PEr overlaps the light-emitting layer EMr, and the light-emitting layer EMg and the light-emitting layer EMb, and therefore, no current flows through the peripheral edge portion EDr (not contributing to red light emission). In the pixel electrode PEr, the valid portion NEr located inside the peripheral edge portion EDr overlaps only the light-emitting layer EMr, and does not overlap the light-emitting layer EMg and the light-emitting layer EMb, and therefore, a current flows through the valid portion NEr (contributing to red light emission).

The opening GK overlaps the entire opening Rk, the pixel electrode PEb overlaps the entire opening Rk and the entire opening Gk, and the entire circumference of the peripheral edge portion EDb of the pixel electrode PEb overlaps the light-emitting layer EMb, and the light-emitting layer EMg and the light-emitting layer EMr, and therefore, no current flows through the peripheral edge portion EDb (not contributing to blue light emission). In the pixel electrode PEb, the valid portion NEb located inside the peripheral edge portion EDb overlaps only the light-emitting layer EMb, and does not overlap the light-emitting layer EMg and the light-emitting layer EMr, and therefore, a current flows through the valid portion NEb (contributing to blue light emission).

In FIG. 7, each of the light-emitting layer EMg, the light-emitting layer EMr, and the light-emitting layer EMg is a layer common to a plurality of adjacent subpixels of the same color. The light-emitting layer EMg includes openings inside the peripheral edge portions of the plurality of pixel electrodes PERi and PERj included in the subpixels SPRi and SPRj of the same color (red) as the subpixel SPr, and overlaps the entire circumferences of the peripheral edge portions. Further, the light-emitting layer EMg includes openings inside the peripheral edge portions of the plurality of pixel electrodes PEBi and PEBj included in the subpixels SPBi and SPBj of the same color (blue) as the subpixel SPb, and overlaps the entire circumferences of the peripheral edge portions. The light-emitting layer EMr includes openings inside the peripheral edge portions of the plurality of pixel electrodes PEGi and PEGj included in the subpixels SPGi and SPGj of the same color (green) as the subpixel SPg, and overlaps the entire circumferences of the peripheral edge portions. Further, the light-emitting layer EMr includes openings inside the peripheral edge portions of the plurality of pixel electrodes PEBi and PEBj included in the subpixels SPBi and SPBj of the same color (blue) as the subpixel SPb, and overlaps the entire circumferences of the peripheral edge portions. The light-emitting layer EMb includes openings inside the peripheral edge portions of the plurality of pixel electrodes PEGi and PEGj included in the subpixels SPGi and SPGj of the same color (green) as the subpixel SPg, and overlaps the entire circumferences of the peripheral edge portions. Further, the light-emitting layer EMb includes openings inside the peripheral edge portions of the plurality of pixel electrodes PERi and PERj included in the subpixels SPRi and SPRj of the same color (red) as the subpixel SPr, and overlaps the entire circumferences of the peripheral edge portions.

In the second embodiment, the order of layering three light-emitting layers overlapping the peripheral edge portion of the pixel electrode (the light-emitting layer EMb, the light-emitting layer EMg, and the light-emitting layer EMr in the order from the lower layer side) are identical throughout the entire circumference of the peripheral edge portion, and an edge of the light-emitting layer on the lower layer side of two light-emitting layers in contact with each other is covered with the light-emitting layer on the upper layer side. In other words, the light-emitting layer EMg covers the edge of the light-emitting layer EMb (including around the openings Bk and bk), and the light-emitting layer EMr covers the edge of the light-emitting layer EMg (including around the openings Gk and gk).

Shapes of the opening bk and the opening BK are different from each other for the light-emitting layer EMb, shapes of the opening gk and the opening GK are different from each other for the light-emitting layer EMg, and shapes of the opening rk and the opening RK are different from each other for the light-emitting layer EMr, and the area of the valid portion NEg of the pixel electrode PEg<the area of the valid portion NEr of the pixel electrode PEr<the area of the valid portion NEb of the pixel electrode PEb.

In the second embodiment, since the peripheral edge of the pixel electrode overlaps three light-emitting layers, degradation of the peripheral edge portion can be more reliably suppressed.

Each of the light-emitting layers EMb, EMg, and EMr is formed in a solid-like form (continuously) across the entire display region, and is provided with two types of openings having different shapes. Therefore, a ground contact area between the light-emitting layer and an underlayer is wide (the adhesive strength of the light-emitting layer is high), and the light-emitting layer does not easily peel off. In an island-shaped lone pattern, a portion of 270° of an outer periphery of a corner is subjected to the processing process, but in a continuous solid-like pattern having openings, a portion of 90° of an inner periphery of a corner of the opening is subjected to the processing process, so the corner of the light-emitting layer can be prevented from peeling.

Figure 8:
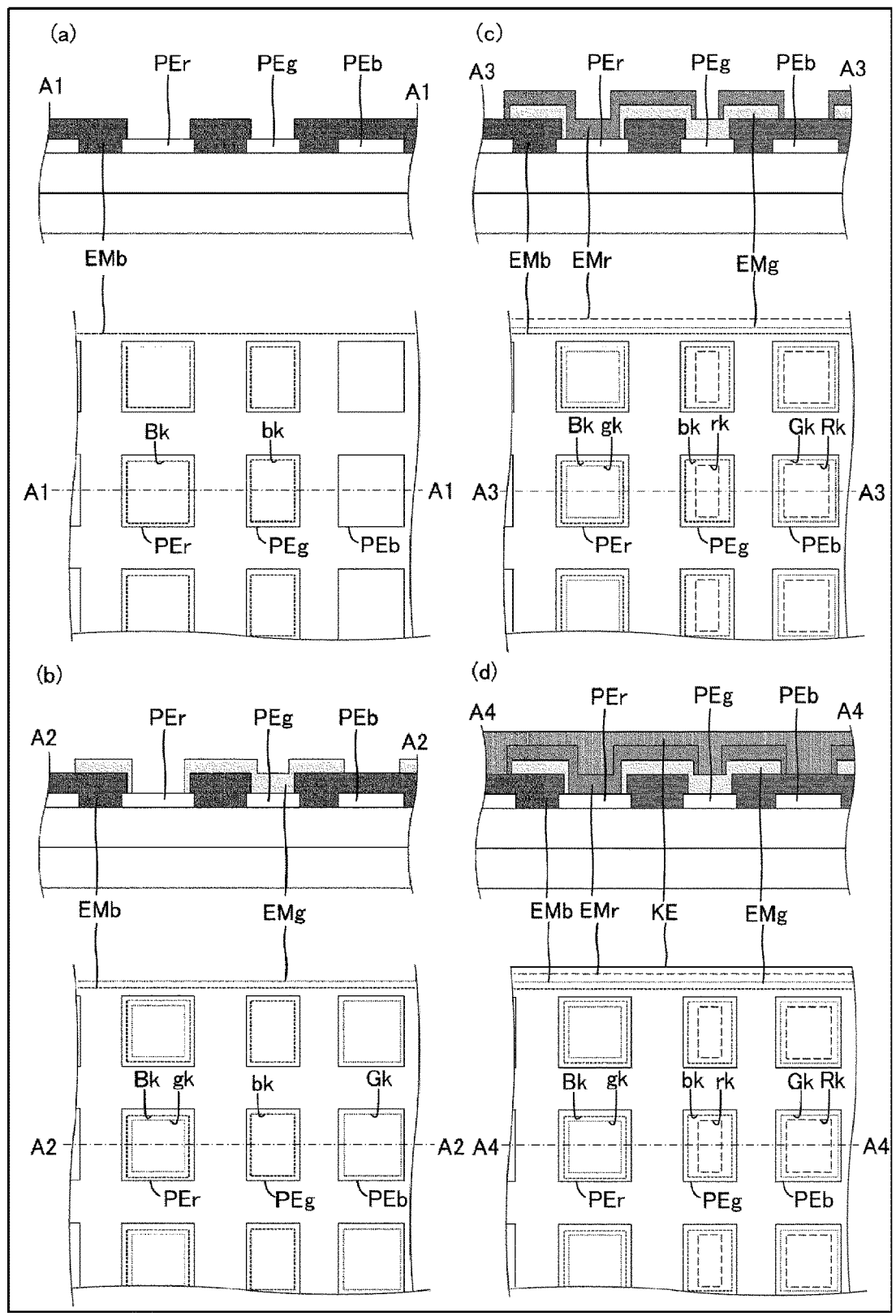
FIGS. 8(a) to 8(d) are correspondence diagrams of cross-sectional and plan views illustrating a process for forming an EL layer and a common electrode layer in the second embodiment.

FIGS. 8(a) to 8(d) are correspondence diagrams of cross-sectional and plan views illustrating a process for forming an EL layer and a common electrode layer in the second embodiment. In forming the EL layer 8, first, the (blue) light-emitting layer EMb overlapping the entire pixel electrode PEb as illustrated in FIG. 8(a) is film formed across the entire display region to form the openings Bk and bk. Next, the (green) light-emitting layer EMg overlapping the entire pixel electrode PEg as illustrated in FIG. 8(b) is film formed across the entire display region to form the openings Gk and gk. Next, the (red) light-emitting layer EMr overlapping the entire pixel electrode PEr as illustrated in FIG. 8(c) is film formed across the entire display region to form the openings Rk and rk. Next, as illustrated in FIG. 8(d), the common electrode KE covering the light-emitting layer EMr is formed.

Figure 9:
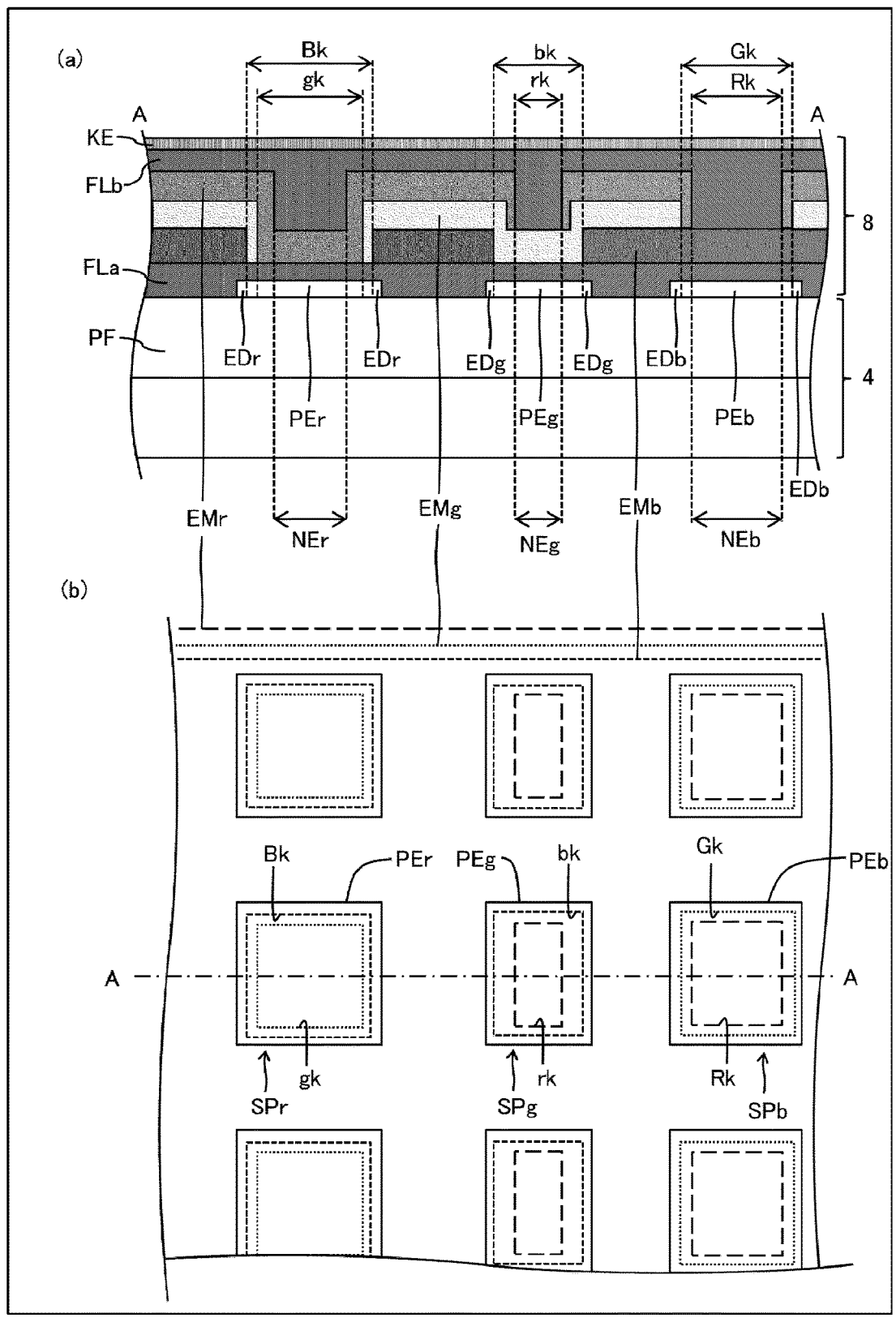
FIG. 9 is a correspondence diagram of cross-sectional and plan views illustrating a modification example of the second embodiment.

FIG. 9 is a correspondence diagram of cross-sectional and plan views illustrating a modification example of the second embodiment. As illustrated in FIG. 9, the lower function layer FLa covering the pixel electrodes PEg, PEr, and PEb may be provided to a lower layer than the light-emitting layer EMb, and the upper function layer FLb covering the light-emitting layers EMr, EMg, and EMb may be provided to a lower layer than the common electrode KE.

Figure 10:
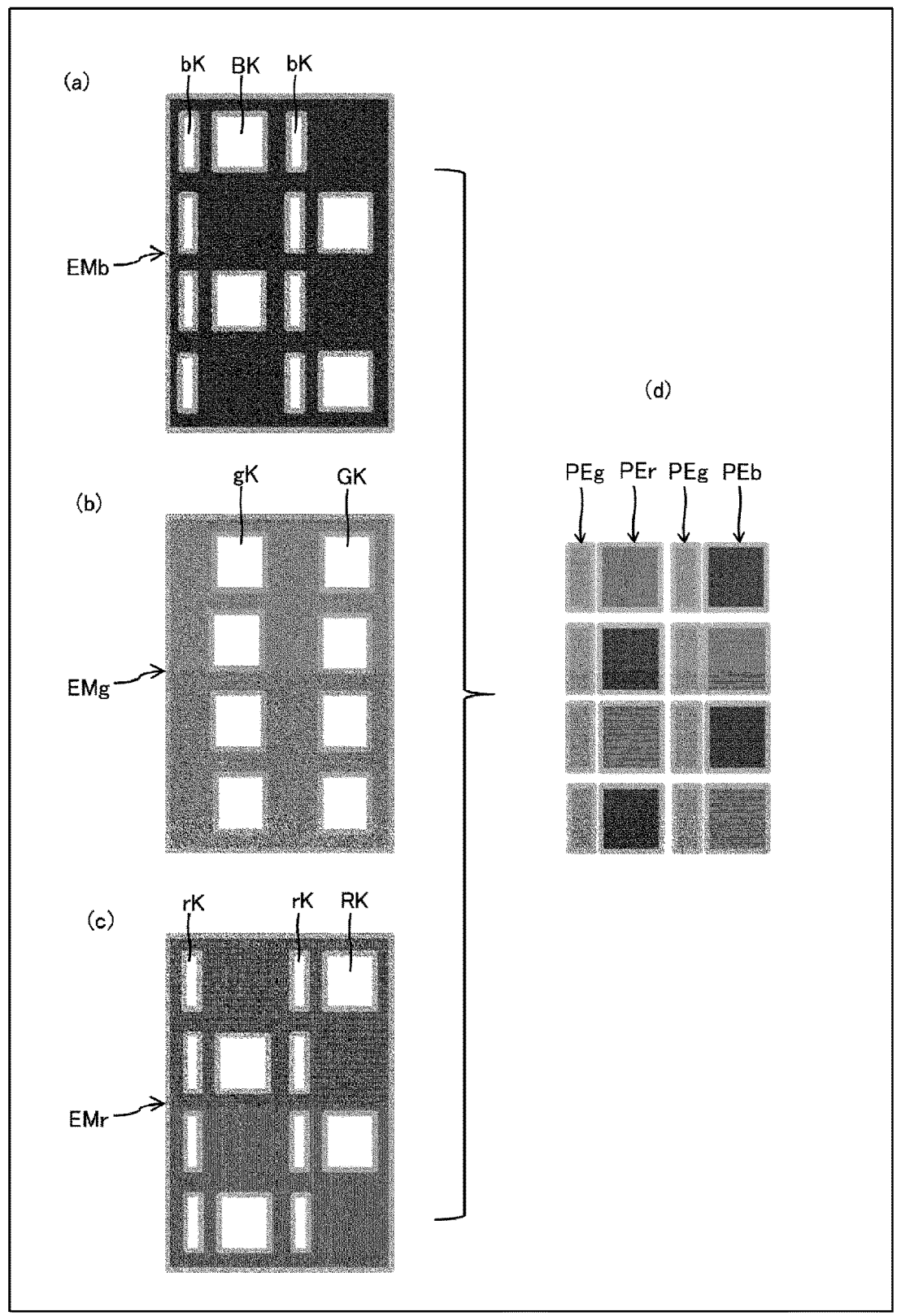
FIG. 10 is a correspondence diagram of cross-sectional and plan views illustrating another modification example of the second embodiment.

FIG. 10 is a correspondence diagram of cross-sectional and plan views illustrating another modification example of the second embodiment, and illustrates, as illustrated in FIG. 10(d), a PenTile display device that includes one red subpixel (including pixel electrodes PEr), two green subpixels (including pixel electrode PEg), and one blue subpixel (including pixel electrode PEb) in two pixel regions. The blue light-emitting layer EMb (see FIG. 10(a)) includes the opening bk overlapping the pixel electrode PEg and the opening BK overlapping the pixel electrode PEr, and formed across the entire display region. The green light-emitting layer EMg (see FIG. 10(b)) includes the opening gk overlapping the pixel electrode PEr and the opening GK overlapping the pixel electrode PEb, and formed across the entire display region. The red light-emitting layer EMr (see FIG. 10(c)) includes the opening rk overlapping the pixel electrode PEg and the opening RK overlapping the pixel electrode PEb, and formed across the entire display region. The blue light-emitting layer EMb, the green light-emitting layer EMg, and the red light-emitting layer EMr are layered in this order. In the case of FIG. 10 also, three light-emitting layers EMb, EMg, and EMr overlap in this order in the peripheral edge portions of the pixel electrodes PEr, PEg, and PEb, and these three light-emitting layers function as edge covers.

Third Embodiment

Figure 11:
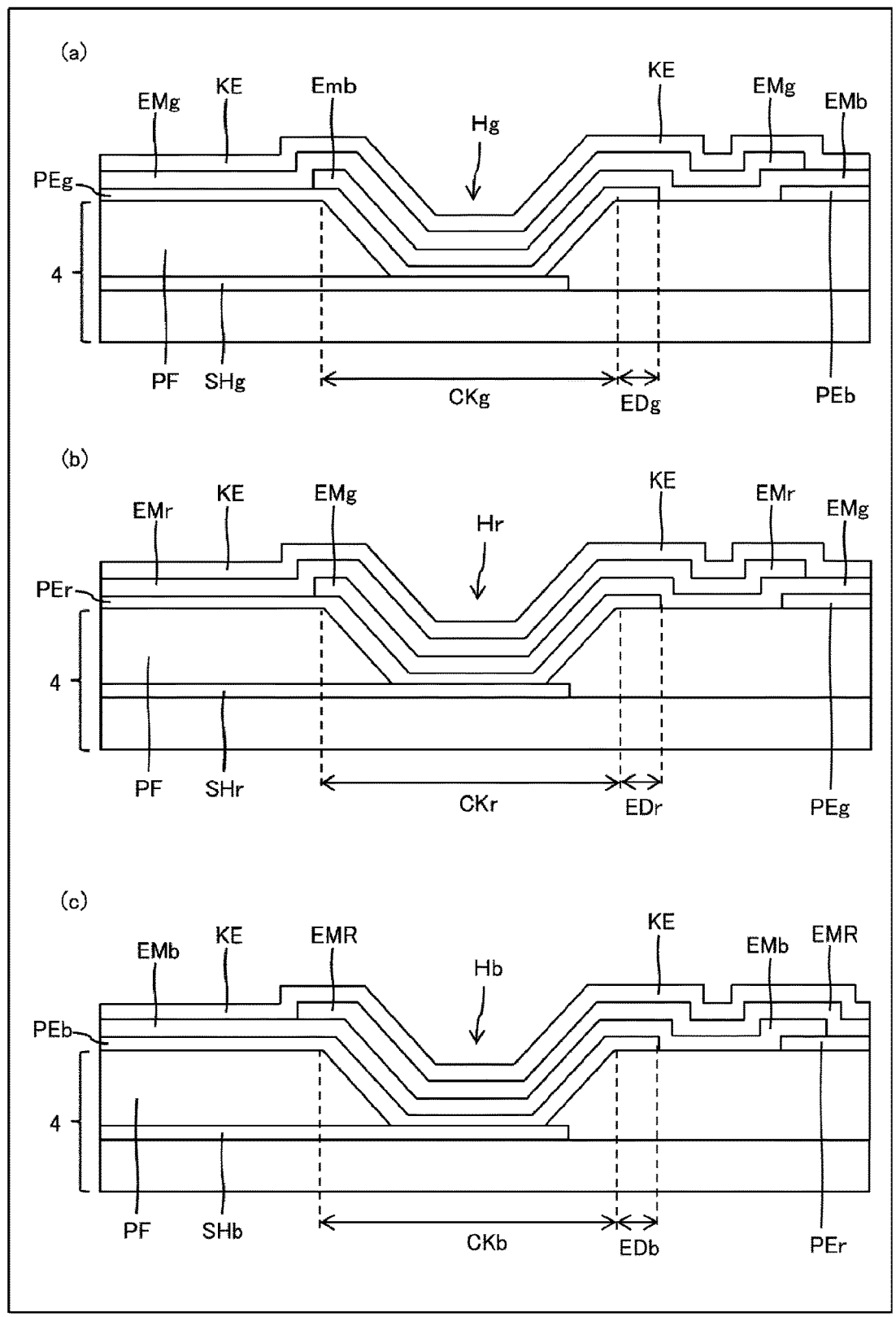
FIG. 11 is a cross-sectional view illustrating a display device according to a third embodiment.

FIG. 11 is a cross-sectional view illustrating a display device according to a third embodiment. In FIG. 11(a), a contact hole Hg is provided in the organic insulating film PF, and the pixel electrode PEg is connected to a wiring line SHg of the TFT layer 4 through the contact hole Hg. Then, the peripheral edge portion EDg of the pixel electrode PEg overlaps two light-emitting layers EMb and EMg, and an entire opening CKg of the contact hole Hg overlaps two light-emitting layers EMb and EMg. This can suppress an overcurrent at an inclined surface (side wall) of the contact hole Hg in addition to an overcurrent at the peripheral edge portion EDg.

In FIG. 11(b), a contact hole Hr is provided in the organic insulating film PF, and the pixel electrode PEr is connected to a wiring line SHr of the TFT layer 4 through the contact hole Hr. Then, the peripheral edge portion EDr of the pixel electrode PEr overlaps two light-emitting layers EMr and EMg, and an entire opening CKr of the contact hole Hr overlaps two light-emitting layers EMr and EMg. This can suppress an overcurrent at an inclined surface (side wall) of the contact hole Hr in addition to an overcurrent at the peripheral edge portion EDr.

In FIG. 11(c), a contact hole Hb is provided in the organic insulating film PF, and the pixel electrode PEb is connected to a wiring line SHb of the TFT layer 4 through the contact hole Hb. Then, the peripheral edge portion EDb of the pixel electrode PEb overlaps two light-emitting layers EMb and EMR, and an entire opening CKb of the contact hole Hb overlaps two light-emitting layers EMb and EMR. This can suppress an overcurrent at an inclined surface (side wall) of the contact hole Hb in addition to an overcurrent at the peripheral edge portion EDb.

Supplement

Aspect 1

A display device including:
a first subpixel including a first pixel electrode;
a second subpixel adjacent to the first subpixel and including a second pixel electrode;
a third subpixel adjacent to the first subpixel and including a third pixel electrode;
a first light-emitting layer overlapping an entire of the first pixel electrode;
a second light-emitting layer overlapping an entire of the second pixel electrode;
a third light-emitting layer overlapping an entire of the third pixel electrode; and
a common electrode in an upper layer than the first light-emitting layer, the second light-emitting layer, and the third light-emitting layer,
wherein an entire circumference of a peripheral edge portion of the first pixel electrode overlaps the first light-emitting layer and at least one of the second light-emitting layer and the third light-emitting layer.

Aspect 2

The display device described in, for example, Aspect 1, wherein a valid portion located inside the peripheral edge portion in the first pixel electrode overlaps the first light-emitting layer, and does not overlap the second light-emitting layer and the third light-emitting layer.

Aspect 3

The display device according to claim 1,
wherein the first subpixel, the second subpixel, and the third subpixel emit light of colors different from each other.

Aspect 4

The display device described in, for example, Aspect 1,
wherein each of the first light-emitting layer, the second light-emitting layer, and the third light-emitting layer is a layer common to a plurality of adjacent subpixels of the same color,
the first light-emitting layer overlaps, in common, portions of peripheral edge portions of the plurality of pixel electrodes included in the plurality of subpixels of the same color as the second subpixel, and overlaps, in common, portions of peripheral edge portions of the plurality of pixel electrodes included in the plurality of subpixels of the same color as the third subpixel,
the second light-emitting layer overlaps, in common, portions of peripheral edge portions of the plurality of pixel electrodes included in the plurality of subpixels of the same color as the first subpixel, and overlaps, in common, portions of peripheral edge portions of the plurality of pixel electrodes included in the plurality of subpixels of the same color as the third subpixel, and
the third light-emitting layer overlaps, in common, portions of peripheral edge portions of the plurality of pixel electrodes included in the plurality of subpixels of the same color as the first subpixel, and overlaps, in common, portions of peripheral edge portions of the plurality of pixel electrodes included in the plurality of subpixels of the same color as the second subpixel.

Aspect 5

The display device described in, for example, Aspect 1,
wherein each of the first light-emitting layer, the second light-emitting layer, and the third light-emitting layer is a layer common to a plurality of adjacent subpixels of the same color,
the first light-emitting layer includes openings inside peripheral edge portions of the plurality of pixel electrodes included in the subpixels of the same color as the second subpixel and overlaps entire circumferences of the peripheral edge portions, and includes openings inside peripheral edge portions of the plurality of pixel electrodes included in the subpixels of the same color as the third subpixel and overlaps entire circumferences of the peripheral edge portions, the second light-emitting layer includes openings inside peripheral edge portions of the plurality of pixel electrodes included in the subpixels of the same color as the first subpixel and overlaps entire circumferences of the peripheral edge portions, and includes openings inside peripheral edge portions of the plurality of pixel electrodes included in the subpixels of the same color as the third subpixel and overlaps entire circumferences of the peripheral edge portions, and the third light-emitting layer includes openings inside peripheral edge portions of the plurality of pixel electrodes included in the subpixels of the same color as the first subpixel and overlaps entire circumferences of the peripheral edge portions, and includes openings inside peripheral edge portions of the plurality of pixel electrodes included in the subpixels of the same color as the second subpixel and overlaps entire circumferences of the peripheral edge portions.

Aspect 6

The display device described in, for example, Aspect 1, further including:

a fourth subpixel adjacent to the first subpixel and including a fourth pixel electrode; and a fifth subpixel adjacent to the first subpixel and including a fifth pixel electrode, wherein an entire of the fourth pixel electrode and an entire of the fifth pixel electrode overlap the first light-emitting layer.

Aspect 7

The display device described in, for example, Aspect 1, wherein a function layer is provided between the first pixel electrode and the first light-emitting layer, the function layer contacting with an entire of the first pixel electrode.

Aspect 8

The display device described in, for example, Aspect 1, wherein the peripheral edge portion of the first pixel electrode includes a portion overlapping the first light-emitting layer and the second light-emitting layer, and a portion overlapping the first light-emitting layer and the third light-emitting layer.

Aspect 9

The display device described in, for example, Aspect 1, wherein an opening overlapping the first pixel electrode is provided to each of the second light-emitting layer and the third light-emitting layer, and the entire circumference of the peripheral edge portion of the first pixel electrode overlaps the first light-emitting layer, the second light-emitting layer, and the third light-emitting layer.

Aspect 10

The display device described in, for example, Aspect 1, wherein in a region where the plurality of light-emitting layers overlap, a light-emitting layer having a larger emission wavelength is positioned in an upper layer than a light-emitting layer having a smaller emission wavelength.

Aspect 11

The display device described in, for example, Aspect 1, wherein each of the first light-emitting layer, the second light-emitting layer, and the third light-emitting layer includes quantum dots and a photosensitive resin.

Aspect 12

The display device described in, for example, Aspect 3, wherein planar shapes of the first light-emitting layer, the second light-emitting layer, and the third light-emitting layer are different from each other.

Aspect 13

The display device described in, for example, Aspect 7, wherein a gap between the first pixel electrode and the second pixel electrode and a gap between the first pixel electrode and the third pixel electrode are filled with the function layer.

Aspect 14

The display device described in, for example, Aspect 1, wherein the first pixel electrode and the second pixel electrode are disposed with a gap on an insulating film, and a distance between the insulating film and the common electrode in the gap is greater than a thickness of the first pixel electrode and less than a width of the gap.

Aspect 15

The display device described in, for example, Aspect 1, wherein the common electrode has a shape in which a portion overlapping the first pixel electrode protrudes toward the first pixel electrode.

Aspect 16

The display device described in, for example, Aspect 1, wherein, in a planar view, a distance from an edge of the first pixel electrode to a light-emitting region of the first subpixel is smaller than a width of the light-emitting region of the first subpixel.

Aspect 17

The display device described in, for example, Aspect 3, wherein a light emission area of the first subpixel, a light emission area of the second subpixel, and a light emission area of the third subpixel are different from each other.

Aspect 18

The display device described in, for example, Aspect 17, wherein in a case where the first light-emitting layer is a green light-emitting layer, the second light-emitting layer is a red light-emitting layer, and the third light-emitting layer is a blue light-emitting layer, the light emission area of the first subpixel<the light emission area of the second subpixel<the light emission area of the third subpixel.

Aspect 19

The display device described in, for example, Aspect 9, wherein in two light-emitting layers in contact with each other, an edge of the light-emitting layer in a lower layer is covered with the light-emitting layer in an upper layer.

Aspect 20

The display device described in, for example, Aspect 9, wherein an entire of the opening of the second light-emitting layer and an entire of the opening of the third light-emitting layer overlap the first light-emitting layer.

Aspect 21

The display device described in, for example, Aspect 9, wherein shapes of the opening of the second light-emitting layer and the opening of the third light-emitting layer are different from each other.

Aspect 22

The display device described in, for example, Aspect 9, wherein an order of layering three light-emitting layers overlapping the peripheral edge portion of the first pixel electrode is identical throughout the entire circumference of the peripheral edge portion.

Aspect 23

The display device described in, for example, Aspect 1, wherein the first pixel electrode is connected to a first wiring line via a contact hole, and an entire of an opening of the contact hole overlaps the first light-emitting layer and at least one of the second light-emitting layer and the third light-emitting layer.

Aspect 24

The display device described in, for example, Aspect 7, wherein the function layer is a common layer for the first subpixel, the second subpixel, and the third subpixel, the function layer including a charge transport layer and a charge injection layer.

The invention claimed is:

1. A display device comprising:
a first subpixel including a first pixel electrode;
a second subpixel adjacent to the first subpixel and including a second pixel electrode;
a third subpixel adjacent to the first subpixel and including a third pixel electrode;
a first light-emitting layer overlapping an entirety of the first pixel electrode;
a second light-emitting layer overlapping an entirety of the second pixel electrode;
a third light-emitting layer overlapping an entirety of the third pixel electrode; and
a common electrode in a layer above the first light-emitting layer, the second light-emitting layer, and the third light-emitting layer,
wherein a central portion of the first pixel electrode is in direct contact with, the first light-emitting layer, and
wherein an entire circumferential edge of the first pixel electrode overlaps, and is in direct contact with at least one of the second light-emitting layer and the third light-emitting layer.

2. The display device according to claim 1,
wherein a valid portion located inside the entire circumferential edge in the first pixel electrode overlaps the first light-emitting layer without overlapping the second light-emitting layer and the third light-emitting layer.

3. The display device according to claim 1,
wherein the first subpixel, the second subpixel, and the third subpixel emit light of colors different from each other.

4. The display device according to claim 1,
wherein each of the first light-emitting layer, the second light-emitting layer, and the third light-emitting layer is a layer common to a plurality of adjacent subpixels of the same color,
the first light-emitting layer overlaps, in common, portions of peripheral edge portions of the plurality of pixel electrodes included in the plurality of subpixels of the same color as the second subpixel, and overlaps, in common, portions of peripheral edge portions of the plurality of pixel electrodes included in the plurality of subpixels of the same color as the third subpixel,
the second light-emitting layer overlaps, in common, portions of peripheral edge portions of the plurality of pixel electrodes included in the plurality of subpixels of the same color as the first subpixel, and overlaps, in common, portions of peripheral edge portions of the plurality of pixel electrodes included in the plurality of subpixels of the same color as the third subpixel, and
the third light-emitting layer overlaps, in common, portions of peripheral edge portions of the plurality of pixel electrodes included in the plurality of subpixels of the same color as the first subpixel, and overlaps, in common, portions of peripheral edge portions of the plurality of pixel electrodes included in the plurality of subpixels of the same color as the second subpixel.

5. The display device according to claim 1,
wherein each of the first light-emitting layer, the second light-emitting layer, and the third light-emitting layer is a layer common to a plurality of adjacent subpixels of the same color,
the first light-emitting layer includes openings inside peripheral edge portions of the plurality of pixel electrodes included in the subpixels of the same color as the second subpixel and overlaps entire circumferences of the peripheral edge portions, and includes openings inside peripheral edge portions of the plurality of pixel electrodes included in the subpixels of the same color as the third subpixel and overlaps entire circumferences of the peripheral edge portions,
the second light-emitting layer includes openings inside peripheral edge portions of the plurality of pixel electrodes included in the subpixels of the same color as the first subpixel and overlaps entire circumferences of the peripheral edge portions, and includes openings inside peripheral edge portions of the plurality of pixel electrodes included in the subpixels of the same color as the third subpixel and overlaps entire circumferences of the peripheral edge portions, and
the third light-emitting layer includes openings inside peripheral edge portions of the plurality of pixel electrodes included in the subpixels of the same color as the first subpixel and overlaps entire circumferences of the peripheral edge portions, and includes openings inside peripheral edge portions of the plurality of pixel electrodes included in the subpixels of the same color as the second subpixel and overlaps entire circumferences of the peripheral edge portions.

6. The display device according to claim 1, further comprising:
a fourth subpixel adjacent to the first subpixel and including a fourth pixel electrode; and
a fifth subpixel adjacent to the first subpixel and including a fifth pixel electrode,
wherein an entirety of the fourth pixel electrode and an entirety of the fifth pixel electrode overlap the first light-emitting layer.

7. The display device according to claim 1,
wherein the entire circumferential edge of the first pixel electrode includes a portion overlapping the first light-emitting layer and the second light-emitting layer, and another portion overlapping the first light-emitting layer and the third light-emitting layer.

8. The display device according to claim 1,
wherein an opening overlapping the first pixel electrode is provided to each of the second light-emitting layer and the third light-emitting layer, and
the entire circumference of the peripheral edge portion of the first pixel electrode overlaps the first light-emitting layer, the second light-emitting layer, and the third light-emitting layer.

9. The display device according to claim 1,
wherein in a region where a plurality of light-emitting layers, including the first, second, and third light-emitting layers, overlaps, a light-emitting layer of the plurality of light-emitting layers that has a larger emission wavelength is positioned in a layer above another light-emitting layer of the plurality of light-emitting layers that has a smaller emission wavelength.

10. The display device according to claim 1,
wherein each of the first light-emitting layer, the second light-emitting layer, and the third light-emitting layer includes quantum dots and a photosensitive resin.

11. The display device according to claim 3,
wherein planar shapes of the first light-emitting layer, the second light-emitting layer, and the third light-emitting layer are different from each other.

12. The display device according to claim 1,
wherein the common electrode has a shape in which a portion overlapping the first pixel electrode protrudes toward the first pixel electrode.

13. The display device according to claim 1,
wherein, in a planar view, a distance from an edge of the first pixel electrode to a light-emitting region of the first subpixel is smaller than a width of the light-emitting region of the first subpixel.

14. The display device according to claim 3,
wherein a light emission area of the first subpixel, a light emission area of the second subpixel, and a light emission area of the third subpixel are different from each other.

15. The display device according to claim 8,
wherein in two light-emitting layers of the first, second and third light emitting layers in contact with each other, an edge of the light-emitting layer in a lower layer is covered with the light-emitting layer in an upper layer.

16. The display device according to claim 8,
wherein an entire of the opening of the second light-emitting layer and an entire of the opening of the third light-emitting layer overlap the first light-emitting layer.

17. The display device according to claim 8,
wherein shapes of the opening of the second light-emitting layer and the opening of the third light-emitting layer are different from each other.

18. The display device according to claim 8,
wherein an order of layering three light-emitting layers overlapping the peripheral edge portion of the first pixel electrode is identical throughout the entire circumference of the peripheral edge portion.

* * * * *